United States Patent [19]
Yamada et al.

[11] Patent Number: 5,349,553
[45] Date of Patent: Sep. 20, 1994

[54] NONVOLATILE SEMICONDUCTOR MEMORY DEVICE

[75] Inventors: Seiji Yamada, Tokyo; Masamitsu Oshikiri, Sagamikara, both of Japan

[73] Assignee: Kabushiki Kaisha Toshiba, Kawasaki, Japan

[21] Appl. No.: 77,719

[22] Filed: Jun. 17, 1993

[30] Foreign Application Priority Data

Jun. 18, 1992 [JP] Japan .................... 4-159485

[51] Int. Cl.⁵ .................... G11C 11/40; G11C 11/24
[52] U.S. Cl. .................... 365/185; 365/189.01
[58] Field of Search ................ 365/185, 189.01, 230.01

[56] References Cited

U.S. PATENT DOCUMENTS 5,136,533  8/1992  Harari ................ 365/149

OTHER PUBLICATIONS

"1991 International Electron Devices Meeting Technical Digest", pp. 11.4.1 through 11.4.4

Primary Examiner—Terrell W. Fears
Attorney, Agent, or Firm—Banner, Birch, McKie & Beckett

[57] ABSTRACT

A nonvolatile semiconductor memory device comprises a memory cell array including memory cell transistors having a lamination gate structure are arranged in a matrix manner at the position where a word line and a bit line cross each other. A lower voltage than a threshold voltage is applied to the word line selected at the time of a reading mode in a state that no electrical charge is stored in the floating gate.

5 Claims, 2 Drawing Sheets

NONVOLATILE SEMICONDUCTOR MEMORY DEVICE

BACKGROUND OF THE INVENTION

1. Field of the Invention

The present invention relates to a nonvolatile semiconductor memory device having a memory cell array structure in which nonvolatile memory cells having a lamination gate structure are arrayed in a matrix manner and more particularly to a nonvolatile semiconductor memory device in which a data hold characteristic of the memory cell is improved and a reading error of data is removed.

2. Description of the Related Art

Generally, in an EEPROM (Electrically Erasable Programmable ROM), a MOS transistor having a lamination gate structure is used as a memory cell. There is known an EPROM with tunnel oxide cell, which is called as an ETOX (registered trademark of U.S. Intel) type cell.

Other than the above cell, there are used an FLOTOX (Floating Gate Tunnel Oxide) cell comprising two transistors, that is, a memory cell transistor and a selective transistor, an ACEE (Advanced Contactless EEPROM) cell in which the selective transistor constituting the FLOTOX is omitted and a drain contact is used in common, or an SISOS (Sidewall Select-gate On Source Side) cell having a side wall selective transistor in a source side.

The following will explain the tunnel oxide type cell among the above conventional cells.

More specifically, in the tunnel oxide type cell, there are formed a source region in which a source voltage is applied to a surface of a semiconductor substrate, a drain region to which a drain voltage is applied, and a channel region between both regions. On the channel region, a floating gate is formed through a gate insulating film. A control gate is laminated on the floating gate through an interlayer insulating film. In the above-structured EPROM with a tunnel oxide cell, data writing is performed by a bit unit, and data erasing is performed by an all bit batch erasing or a selected block unit.

On the other hand, in cell data reading, a low source voltage VD, for example, 0V is applied to the source, and an intermediate drain voltage VD, for example, 1V is applied to the drain. In this case, if a reading voltage Vcc to be applied to the control gate is higher than a reverse voltage of a cell channel, which is a cell threshold voltage, in other words, there is used a cell in which no electron is implanted into the floating gate, current can flow into the channel region and cell data is discriminated as "1." If the electron is implanted into the floating gate, the threshold voltage is higher than the read voltage, no current flows into the channel region, and cell data is discriminated as "0." A data reading control is performed as mentioned manner.

In the above conventional tunnel oxide type memory cell transistor, the threshold value in which the floating gate is not charged either positively or negatively, that is, the floating gate is in an electrically neutral state, was set to an applied voltage to be applied to the control gate at the time of data reading, that is, the applied voltage was set to be lower than 5V. This can be understood from, for example, FIG. 9 of "1991 International Electron Device Meeting Technical Digest." Due to this, if the positive ion comes into the floating gate when the electron is implanted into the floating gate, the threshold value is gradually decreased even if the threshold value is set to be higher than the reading voltage of 5V. Finally, the threshold voltage becomes lower than the reading voltage of 5V. This means that data hold, which is in the state that the electron is implanted in the floating gate, is not in an unfavorable state.

In the above conventional EEPROM, there was an disadvantage in which even if either the floating gate is in the neutral state or the electron is implanted into the floating gate, erroneous data reading will occur since the positive ion comes into the floating gate, which is in the neutral state, from the external portion.

Moreover, in the conventional memory cell array, there was an advantage in which the drain of the memory cell transistor is connected to the bit line through the select gate and degree of freedom in reading data is expanded. However, there was an disadvantage in which a space for arranging the select gate is required.

SUMMARY OF THE INVENTION

In order to eliminate the above-mentioned disadvantages, an object of the present invention is to provide a nonvolatile semiconductor memory device, which can favorably hold data and prevent erroneous data reading even if a positive ion comes out of an external portion.

In order to achieve the above object, the present invention provides a nonvolatile semiconductor memory device comprising a memory cell array including a floating gate, a control gate, and a memory cell transistor group, each having a lamination gate structure, arranged in a matrix manner; a word line group having a plurality of word lines, each provided every row and connected in common to the memory cell transistors arranged in the same row of the memory cell array; a bit line group having a plurality of bit lines, each provided every column and connected in common to the memory cell transistors arranged in the same column of the memory cell array; row decoder means, connected to each word line, for selectively driving an arbitrary word line of the word line group, the row decoder means applying a lower voltage than a threshold voltage applied to the control gate to the word line selected at the time of a reading mode in a state that no electrical charge is stored in the floating gate; and a column decoder means, connected to each bit line, for selectively driving an arbitrary word bit line of the bit line group at the time of a read mode.

According to the above-structured nonvolatile semiconductor memory device, the threshold value is set to be higher than the voltage value, thereby data can be read without generating an error in a neutral state that no electron is implanted into the floating gate even if the positive ion comes out of the external portion, and a data hold characteristic can be favorably held and data reading can be performed without generating an error in a state that the electron is implanted into the floating gate.

Moreover, since the drain of the memory cell transistor is connected to the bit line through no select gate, a high density structure can be obtained without providing a space for arranging the select gate.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the nonvolatile semiconductor memory device of the present invention will be explained with reference to the drawings.

Figure 1:
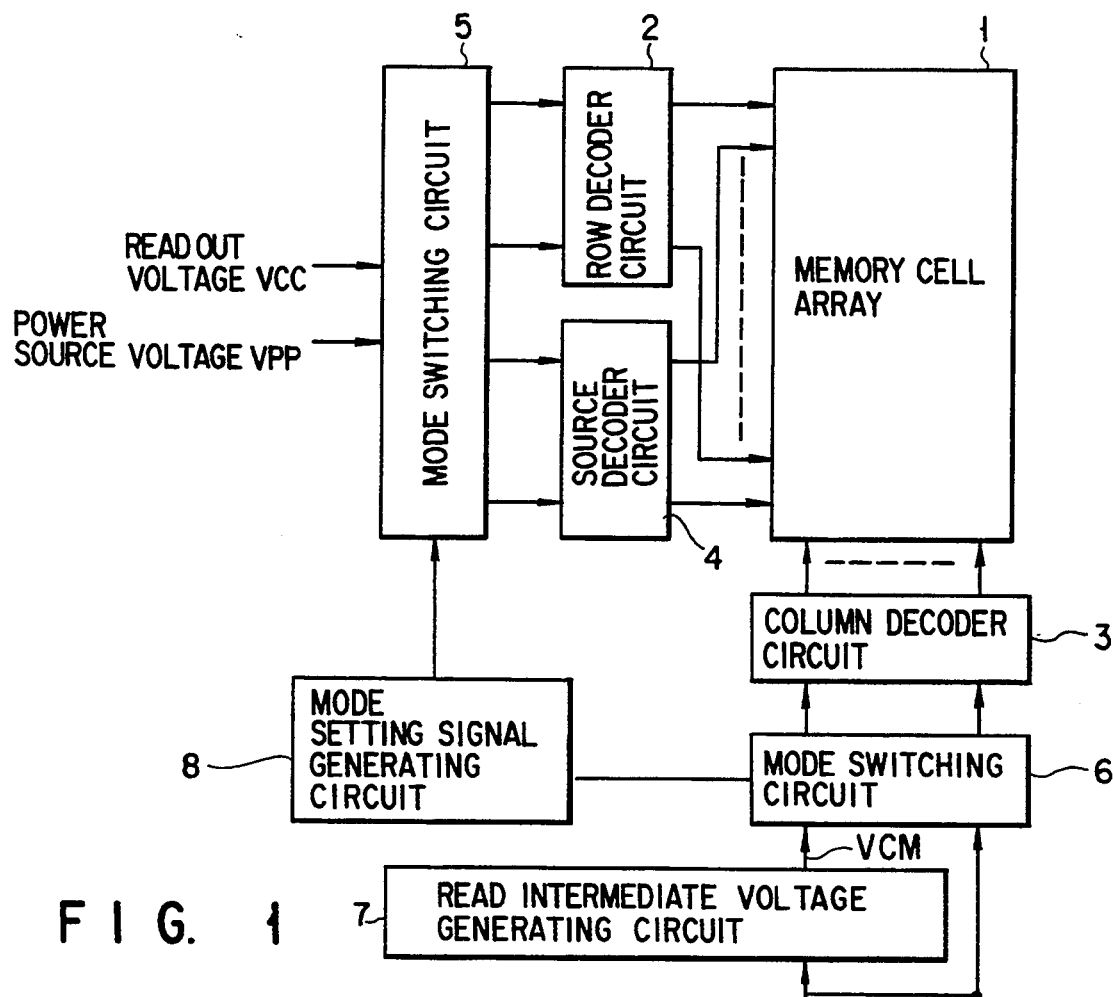
FIG. 1 is a block diagram showing the schematic structure of an EEPROM according to one embodiment of the nonvolatile semiconductor memory device of the present invention.

FIG. 1 shows a block circuit diagram of an EEPROM including a memory cell array 1. The memory cell array 1 has a plurality of cells arranged in a matrix manner, and a row decoder circuit 2 and a source decoder circuit 4 are connected to each word line in a row direction and each source line to correspond to each other, respectively.

A source voltage Vpp or a read voltage Vcc is applied to the row decoder circuit 2 and the source decoder circuit 4 through a mode switching circuit 5 to be switchable. Each bit line in the column direction is connected to a column decoder circuit 3, and a read voltage Vcc and a read intermediate voltage VCM, which is sent from a read intermediate voltage generating circuit 7, are applied thereto through one mode switching circuit 6. In the mode switching circuits 5 and 6, the switching operation is performed by a signal sent from a mode setting signal generating circuit 8.

Figure 2:
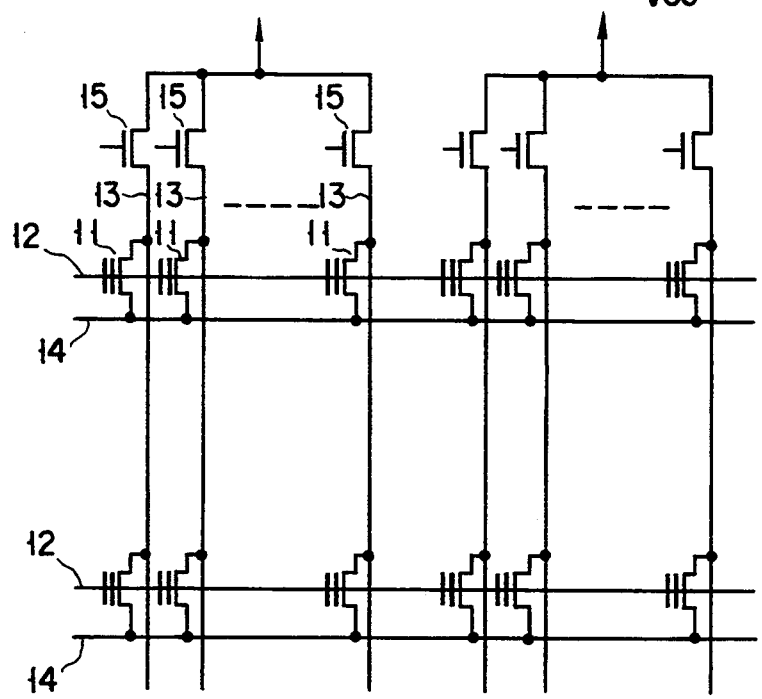
FIG. 2 is a view showing a part of a circuit structure of a memory array shown in FIG. 1.

FIG. 2 shows a part of the memory cell array of FIG. 1. Memory cells 11 having the lamination structure such as tunnel oxide cells are arranged in a matrix manner. Control gates of the plurality of memory cells 11 arranged in the same row of the memory cell array 1 are connected to a word line 12 in common. Drains of the plurality of memory cells 11 arranged in the same column of the memory cell array 1 are connected to a bit line 13 in common through no select gate.

Drains of the plurality of memory cells 11 arranged in the same row of the memory cell array 1 are connected to a source line 14 in common.

In an EEPROM shown in FIG. 1, it is assumed that the structure in which data reading/writing is performed in a state that a plurality of bits are arranged in parallel, that is, a plural bit structure. In the memory cell 11, one cell group is formed by the bit line unit for every parallel bits. Each grouped plurality of bit lines 13 is connected to a sense amplifier (not shown) through each column selective transistor 15.

Figure 3:
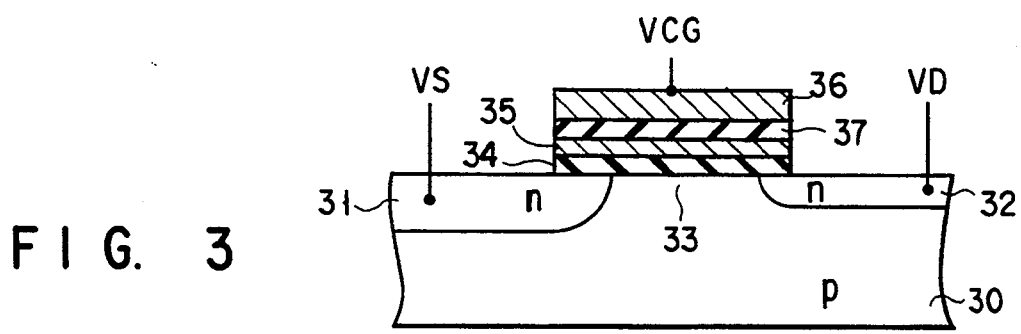
FIG. 3 is a cross sectional view of a main part of the structure of a tunnel oxide cell according to one embodiment of the cell shown in FIG. 2.

FIG. 3 shows one example of the cross section structure of the tunnel oxide cell shown in FIG. 2.

A first impurity region (source) of second conductivity type (e.g., n-type region where arsenic or phosphorus is doped), which is opposite to a semiconductor substrate 30 of first conductivity type (e.g., p-type Si substrate), and a second impurity region (drain) are selectively formed on the surface of the semiconductor substrate 30. A channel region 33 is formed between the source of the surface of the semiconductor substrate and the drain. An $SiO_2$ film (tunnel insulating film) 34 of about 10 nm is formed on the surface of the semiconductor substrate. A floating gate 35 is formed on the channel region 33 of the semiconductor substrate and one end portion of the impurity region (source) 31 through the tunnel insulating film 34, and, for example, an oxide film of about 100 nm is used as floating gate 35. For example, an interlayer insulating film 37, which is formed of thermal oxide film of polycrystalline silicon/CVD silicon nitride film/thermal oxide film, is formed on the floating gate 35. A control gate 36 is formed on the floating gate 35 through the interlayer insulating film 37, and, for example, phosphorus-doped polycrystalline silicon of about 400 nm is used as control gate 36. As explained above, the floating gate 35 and the control gate 36 have the lamination gate structure.

The following will explain one example of the relationship of the voltage between the respective parts in each operation mode of the tunnel oxide cell, and the operation principle.

(1) At the time of data (program) writing, a low voltage (e.g., 0V) serving as a source voltage VS is applied to the source 31, a low voltage (e.g., 0V) is applied to the substrate 30, a writing voltage VPP (high voltage) serving as a control gate voltage VCG is applied to the control gate 36, and a drain voltage (high voltage) VD is applied to the drain 32. As a result, on-current flows between the drain and source, and a hot electron and a pair of hot holes are generated in the vicinity of the drain. Then, the holes serving as a substrate current flow into the substrate 30. However, the hot electron is implanted to the floating gate 35, thereby the threshold rises in view of the control gate 36 of the transistor, and the writing operation is finished.

(2) At the time of erasing data, a high voltage VPP is applied to the source 31, a low voltage (e.g., 0V) is applied to the control gate 36, and the drain 32 is set to, for example, a floating state. In this case, a floating gate voltage VFG is set in accordance with the capacity ratio of the capacity between the control gate 36 and the floating gate 35 to the capacity between the floating gate 35 and the source 31, and the source voltage VS. Then, a Fowler-Nordheim tunnel current flows into the tunnel insulating film 34 between the source 31 and the floating gate 35. Thereby, the electron is extracted from the floating gate, and the erasing operation is finished (the threshold is in the state which is before the wiring).

(3) At the time of reading data, a low voltage serving as a source voltage VS (e.g., 0V) is applied to the source, a read intermediate voltage serving as a drain voltage VD (e.g., 1V) is applied to the drain, and a read voltage serving as a control gate voltage VCG (normally, power-supply voltage VCC) is applied to the control gate. In this case, cell data is read by use of the points that the current flows to the cell whose threshold is lower than the read voltage VCC (no electron is implanted to the floating gate), and no current flows to the cell whose threshold is higher than the read voltage VCC (the electron is implanted to the floating gate).

In FIG. 1, the row decoder circuit 2 is used for selectively driving the word line group 12; the column decoder circuit 3 is used for selectively driving the bit line group 13; and the source decoder circuit 4 is used for controlling the voltage of the source line group 14.

In the EEPROM of the above-explained embodiment, at the time of the writing mode, the high voltage is applied to the bit line 13 of the column (selected column) including the selected memory cell, the write voltage VPP is applied to the word line 12 of the row (selected row) including the selected memory cell. Then, the low voltage (e.g., 0V) is applied to the source of the selected memory cell or the source is set to the floating state. Thereby, data writing is performed in the selected memory cell.

At the time of the flash erasing mode, all word lines 12 are grounded, all column selective transistors 15 are controlled to be in an off-state, and all bit lines 13 are in a floating state. Then, the high voltage VPP is applied to all sources. Thereby, data erasing is performed in all memory cells.

At the time of the reading mode, the read voltage (voltage VCC of 5V in this example) is applied to the word line 12 of the selected row. Then, the read intermediate voltage (e.g., 1V) is applied to the bit line 13 of the selected column.

In this case, according to the embodiment, the row decoder circuit 2 applies the low voltage (e.g., 5V), which is lower than the reverse voltage (threshold voltage) in view of the control gate 36, to the selected word line 12 in a state that no electrical charge is stored in the floating gate 35 of the tunnel oxide cell 11.

In other words, the tunnel oxide cell 11 used in the embodiment of the present invention is characterized in the following points.

More specifically, the drain 32 is connected to the bit line 13 through no select gate, and the reverse voltage of the channel in view of the control gate 36 (the threshold of the cell) is set to be higher than the voltage (5V in this example) applied to the control gate 36 at the time of the reading mode in the neutral state that no electrical charge is stored in the floating gate 35. It is noted that the threshold of the conventional tunnel oxide cell is 5V or less in the neutral state that no electrical charge is stored in the floating gate 35.

In order to realize that the threshold of the cell is set to be higher than the voltage of 5V in the neutral state that no electrical charge is stored in the floating gate, the following methods can be considered:

(1) Implantation dose of impurity (e.g., boron) to the surface of the channel region 33 of the tunnel oxide cell having the structure as shown in FIG. 3 is set to be larger than the conventional implantation dose (e.g., $5 \times 10^{14}/cm^2$ or more).

Figure 4:
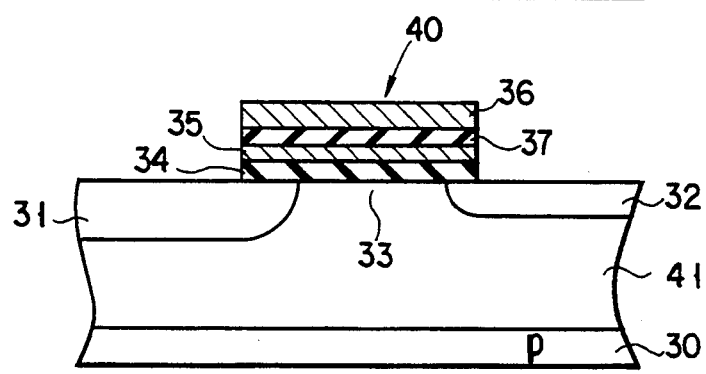
FIG. 4 is a cross sectional view of a main part of the structure of a cell according the other embodiment.

(2) In the case of the structure in which a cell transistor 40 is formed in a P-well 41 as shown in FIG. 4, concentration of the impurity of the P-well 41 (e.g., boron) is increased.

Figure 5:
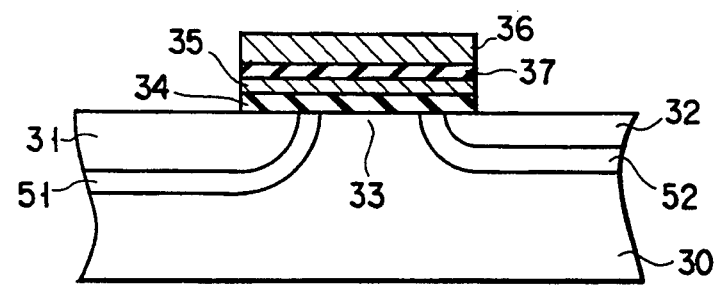
FIG. 5 is a cross sectional view of a main part of the structure of a cell according further other embodiment.

(3) In the case of the structure in which the portion around the source 31 of the cell transistor or the portion around the drain 32 is covered with p-type impurity (e.g., boron) regions 51 and 52 as shown in FIG. 5, concentration of the impurity regions 51 and 52 is set to be high (e.g., $3 \times 10^{14}/cm^3$ or more)

(4) Electrostatic capacity between the floating gate 35 of the tunnel oxide cell having the structure as shown in FIG. 3 and the control gate 36 is reduced. More specifically, the coupling area of both gates is reduced and the interlayer insulating film 37 is thickened.

(5) The tunnel insulating film 34 of the tunnel oxide cell having the structure as shown in FIG. 3 is thickened.

Any method may be selected from the above methods if the threshold of the cell can be resultingly set to be higher than the voltage of 5V in the neutral state that no electrical charge is stored in the floating gate 35.

Figure 6:
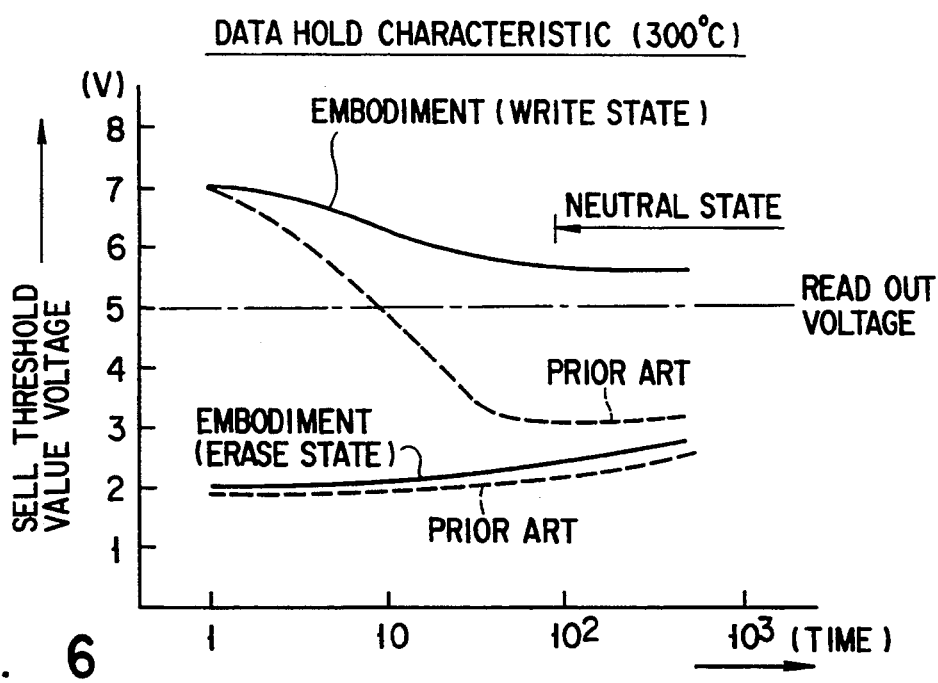
FIG. 6 is a characteristic view showing a comparison between a data hold characteristic of the cells of FIGS. 3 to 5 and that of the conventional cell.

FIG. 6 shows an example of data hold characteristic in the case that the tunnel oxide cell is left to stand at 300° C. In this FIGURE, the solid line shows the characteristic of the tunnel oxide cell of the embodiment of the present invention in which the threshold of the cell can be resultingly set to be higher than the voltage of 5V in the neutral state that no electrical charge is stored in the floating gate. The dotted line shows the characteristic of the conventional tunnel oxide cell for the comparison between the tunnel oxide cell of the present invention and the conventional tunnel oxide cell.

As is obvious from FIG. 6, according to the conventional tunnel oxide cell, even if the threshold of the cell is 7V right after the electron is implanted to the floating gate, the threshold is rapidly reduced to 5V or less with a lapse of time by the penetration of the positive ion.

In contrast, according to the tunnel oxide cell of the present invention, even if the floating gate is completely neutralized by the penetration of the positive ion, the threshold is maintained to be higher than 5V or more, so that no erroneous data reading is generated.

Since the penetration of the negative ion is relatively small, there is no possibility that the threshold will vary to such an extent that erroneous data reading is generated even if the threshold of the tunnel oxide cell of the present invention is 2V right after the erasing. Therefore, it is possible to obtain the cell having extremely high reliability.

Moreover, in the structure of the well-known tunnel oxide cell using 16M bit, in the case that no electrical charge is applied to the floating gate, the relationship between the threshold vthcg of the channel in view of the control gate and the threshold vthfg of the channel in view of the floating gate is as follows.

$$vthfg = K \times vthcg$$

wherein K is called as a coupling ratio and the preferable range is generally 0.6 to 0.4.

In other words, the threshold vthfg may be set to 3V or more so as to set the vthcg to be higher than 5V or more. In this case, if it is assumed that the thickness of the tunnel insulating film is about 10 nm in the future, the threshold vthcg of 5V or more can be realized by setting the surface concentration of the p-type impurity (e.g., boron) of the channel region 33 to $1 \times 10^{18}/cm^3$ or more.

In the above embodiment, the voltage VCG of the control gate of the tunnel oxide cell at the time of reading mode was set to 5V. However, there is no need that the voltage VCG is always set to 5V. In the case that data is read by the read voltage, which is lower than 5V, it is needless to say that the same technical advantage as the embodiment of the present invention can be obtained if the threshold of the cell in the neutral state is more than the read voltage VCC.

Moreover, in the above embodiment, the tunnel oxide cell was used as a memory cell. However, the memory cell is not limited to the tunnel oxide cell. If there is used the structure having no select gate for cutting-off the current of the cell other than the cell to be used at the time of the reading mode, the present invention can be effectively applied to such structure.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A nonvolatile semiconductor memory device comprising:
    a memory cell array including a plurality of memory cell transistors arranged in a row and column matrix, wherein said memory cell transistors comprise a floating gate and a control gate having a lamination gate structure;
    a word line group having a plurality of word lines, wherein each word line corresponds to a row of said memory cell array and is connected in common to said memory cell transistors arranged in the corresponding row of said memory cell array;
    a bit line group having a plurality of bit lines, wherein each bit line corresponds to a column of said memory cell array and is connected in common to said memory cell transistors in the corresponding column of said memory cell array;
    row decoder means, connected to each word line, for selectively driving an arbitrary word line of said word line group, wherein said row decoder means when in a read mode applies a voltage to the arbitrary word line that is lower than a threshold voltage of said memory cell transistors in a state in which said floating gate stores no electrical charge; and
    column decoder means, connected to each bit line, for selectively driving an arbitrary bit line of said bit line group when in the read mode.

2. The device according to claim 1, wherein each said memory cell transistor further comprises:
    a semiconductor substrate; and
    a drain region and a source region formed on a surface of said semiconductor substrate, said drain region having a first impurity region whose conductivity type is opposite to the conductivity type of said semiconductor substrate,
    wherein:
    the floating gate is formed on said drain region of said semiconductor substrate and on a channel region between said source region through a gate insulating film,
    the control gate is formed on said floating gate through an insulating film and is coupled to one of said word lines, and
    the threshold voltage of said memory cell transistors when in a state in which said drain is connected to the bit line and no electrical charge is stored in said floating gate is greater than the voltage applied to said control gate from said decoder means when in the read mode.

3. The device according to claim 2, wherein said memory cell transistor is a tunnel oxide cell.

4. The device according to claim 2, wherein a conductivity type of said channel region is the same as the conductivity type of said semiconductor substrate and wherein an impurity concentration of at least one part of said channel region is $1 \times 10^{18}/cm^3$ or more.

5. The device according to claim 4, wherein said impurity is boron.

* * * * *